United States Patent
Monnoyer et al.

(10) Patent No.: US 9,670,576 B2
(45) Date of Patent: Jun. 6, 2017

(54) STEEL SHEET INCLUDING A MULTILAYER COATING AND METHODS

(75) Inventors: Maxime Monnoyer, Sainte-Marie-Aux-Chenes (FR); Daniel Chaleix, Verny (FR); Christian Allely, Metz (FR); Daniel Jacques, Thionville (FR); Julie Chassagne, Liege (BE)

(73) Assignee: ARCELORMITTAL INVESTIGACIÓN Y DESARROLLO SL, Sestao, Bizkaia (ES)

( * ) Notice: Subject to any disclaimer, the term of this patent is extended or adjusted under 35 U.S.C. 154(b) by 394 days.

(21) Appl. No.: 13/995,107

(22) PCT Filed: Dec. 17, 2010

(86) PCT No.: PCT/FR2010/000848
§ 371 (c)(1),
(2), (4) Date: Jul. 24, 2014

(87) PCT Pub. No.: WO2012/080581
PCT Pub. Date: Jun. 21, 2012

(65) Prior Publication Data
US 2015/0013409 A1 Jan. 15, 2015

(51) Int. Cl.
| | |
|---|---|
| C23C 14/16 | (2006.01) |
| C23C 14/08 | (2006.01) |
| C23C 14/58 | (2006.01) |
| C23C 28/02 | (2006.01) |
| B21C 9/00 | (2006.01) |
| C22C 18/00 | (2006.01) |
| C22C 18/04 | (2006.01) |
| C23C 2/06 | (2006.01) |
| C23C 2/26 | (2006.01) |
| C23C 2/40 | (2006.01) |
| C23C 28/00 | (2006.01) |
| B21C 43/02 | (2006.01) |

(52) U.S. Cl.
CPC .............. *C23C 14/16* (2013.01); *B21C 9/005* (2013.01); *B21C 43/02* (2013.01); *C23C 2/06* (2013.01); *C23C 2/26* (2013.01); *C23C 2/40* (2013.01); *C23C 14/081* (2013.01); *C23C 14/083* (2013.01); *C23C 14/584* (2013.01); *C23C 28/00* (2013.01); *C23C 28/023* (2013.01); *C23C 28/025* (2013.01); *C23C 28/3225* (2013.01); *C23C 28/34* (2013.01); *C22C 18/00* (2013.01); *C22C 18/04* (2013.01); *Y10T 428/12611* (2015.01); *Y10T 428/12736* (2015.01); *Y10T 428/12799* (2015.01)

(58) Field of Classification Search
CPC ........ C23C 14/16; C23C 14/165; C23C 14/14; C23C 14/081; C23C 14/08; C23C 14/083; C23C 28/021; C23C 28/023; C23C 28/025

See application file for complete search history.

(56) References Cited

U.S. PATENT DOCUMENTS

| | | | | |
|---|---|---|---|---|
| 3,438,754 | A | * | 4/1969 | Brooker .................... C23C 2/06 205/192 |
| 4,659,631 | A | * | 4/1987 | Kurimoto ............. C23C 28/023 428/624 |
| 4,670,354 | A | | 6/1987 | Dubois et al. |
| 5,747,111 | A | * | 5/1998 | Fukui .................... C23C 14/024 427/250 |
| 2004/0029749 | A1 | * | 2/2004 | Legros ................. C10M 169/04 508/487 |
| 2008/0063896 | A1 | * | 3/2008 | Fujibayashi .......... B32B 15/013 428/684 |

FOREIGN PATENT DOCUMENTS

| | | |
|---|---|---|
| EP | 0636709 A1 | 2/1995 |
| EP | 0890655 A1 | 1/1999 |
| EP | 2213757 A2 | 8/2010 |
| FR | 1572638 A | 6/1969 |
| GB | 2161499 A | 1/1986 |
| JP | 01116062 A * | 5/1989 |
| LU | 86738 A1 | 8/1988 |

\* cited by examiner

*Primary Examiner* — Livius R Cazan
(74) *Attorney, Agent, or Firm* — Davidson, Davidson & Kappel, LLC

(57) ABSTRACT

A steel sheet is provided. The steel sheet includes a multilayer coating including at least one zinc-based layer being 0.1% to 20% magnesium by weight which is covered by a fine temporary protective layer of 5 to 100 nm. The fine temporary protective layer is composed of metal or metal oxide selected from the group consisting of aluminum, chromium, aluminum oxides AlOx, with x being strictly between 0.01 and 1.5 and chromium oxides CrOy, with y being strictly between 0.01 and 1.5. The at least one zinc-based layer is not alloyed with the temporary protective layer. Manufacturing methods for a sheet and part are also provided.

11 Claims, No Drawings

STEEL SHEET INCLUDING A MULTILAYER COATING AND METHODS

The present invention relates to a steel sheet with a multilayer coating at least one layer of which includes a zinc-magnesium alloy, which is more particularly intended for, without being limited to, the manufacture of automotive parts.

BACKGROUND

Galvanized coatings consisting essentially of zinc are traditionally used for their high level of protection against corrosion, in the automotive industry or in construction, for example. However, these coatings cause solderability problems and are now facing competition from zinc coatings containing magnesium.

Indeed, the addition of magnesium significantly increases the resistance to pitting corrosion of these coatings, which can help reduce their thickness and thus improve their weldability or even maintain the coating thickness and increase the guarantee of protection against corrosion over time.

In addition, corrosion resistance is improved so much that it is now possible to reduce or even eliminate the use of secondary protection measures such as the use of waxes or sealants in places where corrosion is most likely to occur.

However, steel coils with such surface coatings can sometimes stay in storage warehouses for several months and this surface should not be altered by the appearance of surface corrosion before being shaped by the end user. In particular, no initial corrosion should appear regardless of the storage environment, even in cases of exposure to the sun and/or a humid or saline environment.

The standard galvanized products are also subject to these constraints and are coated with a protective oil that is generally sufficient.

SUMMARY OF THE INVENTION

However, these inventors have found that coatings containing magnesium do not provide adequate temporary protection against corrosion, even after being coated with protective oil. In fact, the formation of black spots corresponding to the formation of a zinc-magnesium oxide has been observed.

There is therefore a need to develop an effective system of temporary protection for such coatings.

In addition, such a system must be compatible with subsequent manufacturing steps such as painting (phosphating ability) and be easily removable, hence its classification as temporary.

In the automotive field, it must also provide good protection against cosmetic corrosion, which means the deterioration in appearance of the visible parts of a vehicle that have experienced exposure to gravel, bumps, scratches, and of the edges and corners of the panels constituting the vehicle.

Furthermore, the implementation of such temporary protection systems should take place under industrial conditions, i.e., it should preferably allow depositions with a thickness up to 100 nm per side to be obtained at movement rates of up to 300 m/min.

An object of the present invention is to overcome the disadvantages of coated steels and manufacturing processes of the prior art by providing a coated steel sheet with both good resistance to pitting corrosion and good resistance to surface corrosion, using a temporary protection system that is easily removable prior to painting. It must also preferably display good resistance against cosmetic corrosion and good phosphating ability. The manufacturing process must, in turn, make possible the achievement of processing rates compatible with industrial requirements.

The present invention provides a steel plate fitted with a multilayer coating including at least one zinc-based layer including from 0.1% to 20% magnesium by weight, topped with a fine temporary protective layer of between 5 and 100 nm and formed from metal or metallic oxide selected from the group consisting of aluminum, chromium, AlOx aluminum oxides, with x being strictly between 0.01 and 1.5 and CrOy chromium oxides, with y being strictly between 0.01 and 1.5, and with said zinc-based layer of 0.1% to 20% magnesium by weight not being alloyed with said temporary protective layer.

The sheet may, according to the present invention, also include the following features, either alone or in combination:

the multi-layer coating includes an initial zinc-based layer of less than 0.05% magnesium by weight topped by a second zinc-based layer of 0.1% to 20% magnesium by weight, which is in turn topped by a fine temporary protective layer of between 5 and 100 nm composed of metal or metal oxide selected from the group consisting of aluminum, chromium, AlOx aluminum oxides, with x being strictly between 0.01 and 1.5 and CrOy chromium oxides, with y being strictly between 0.01 and 1.5, and with said zinc-based layer containing 0.1% to 20% magnesium by weight not being alloyed with said temporary protective layer or with said zinc-based layer of less than 0.05% magnesium by weight;

the zinc-based layer or layers further include 0.1% to 10% aluminum by weight, the zinc-based layer of 0.1% to 20% magnesium by weight is formed from $Zn_2Mg$, the temporary protective layer is formed from aluminum, the temporary protective layer has a thickness of between 5 and 50 nm.

The present invention also provides a manufacturing process for a sheet with a multilayer coating according to the present invention, in which a bare steel sheet is fed and is then successively coated with the various layers of said multilayer coating, and the temporary protective layer is deposited by vacuum deposition.

Preferably, all layers of the multilayer coating are deposited by vacuum deposition.

The present invention further provides a manufacturing process from a sheet according to the present invention, in which said metal sheet is coated with a lubricating oil in an amount less than or equal to 1 $g/m^2$, then said sheet is formed by drawing and subjected to alkaline degreasing.

Other features and advantages of the invention will become apparent upon reading the following description, which is given as a non-limiting example.

DETAILED DESCRIPTION

The sheet coated according to the invention comprises first and foremost of a substrate of steel, preferably hot-rolled and then cold-rolled to be used as body parts for motor vehicles. The invention is not however limited in this area and can be used for any steel part regardless of its end use.

This sheet is provided with a multilayer coating of necessity of a zinc-based layer including 0.1% to 20% magnesium by weight, which shall be further designated as a zinc-based layer containing magnesium. This coating layer generally has a thickness less than or equal to 20 gm and is intended to protect the steel substrate against pitting corrosion. At least 0.1% magnesium by weight is added because no protective effects against pitting are visible below that. Preferably, at least 0.5%, preferably at least 2%, magnesium by weight is added. Its content is limited to 20% by weight because it has been observed that a larger proportion would result in a too rapid consumption of the coating and thus paradoxically degraded corrosion performance.

This coating layer may be obtained in particular by a vacuum deposition method such as, for example, magnetron sputtering, electron beam deposition, or vacuum evaporation by Joule effect or induction. In this case, the layer will generally include only zinc and magnesium; other elements, such as aluminum or silicon, can, however, be added, if necessary, to improve other properties of the coating such as its ductility or adhesion to the substrate. When the coating includes only zinc and magnesium, it is preferred that the coating layer include between 14% and 18% magnesium by weight and, more preferably, that it correspond largely to the intermetallic compound with the formula $Zn_2Mg$, which includes about 16% magnesium by weight, which has particularly good properties of resistance to pitting corrosion.

When the coating includes zinc, magnesium, and aluminum, it is preferred that the coating layer be between 2% and 4% magnesium by weight and between 2% and 4% aluminum by weight, i.e., that it be close to the composition of the zinc/aluminum/magnesium ternary eutectic.

When applied directly onto steel, this coating layer may also be obtained by a method of hot-dip coating in a molten zinc bath containing magnesium and aluminum up to a content of 10% by weight. The bath may also contain up to 0.3% by weight of optional additive elements such as Si, Sb, Pb, Ti, Ca, Mn, Sn, La, Ce, Cr, Ni, Zr, or Bi. These elements may make it possible to, among other things, improve the ductility and adhesion of the coating, for example. The skilled person who knows their effects on the characteristics of the coating will know how to use them depending on the additional purpose needed. Finally, the bath may contain residual elements from ingot feedstock or resulting from the placing of the strip into the bath.

The multilayer coating of the sheet according to the present invention then includes a thin layer 5 to 100 nm thick, preferably between 5 and 90 nm, more preferably between 5 and 50 nm, or even between 5 and 40 nm, of a metal selected from among aluminum and chromium or an aluminum or chromium metal oxide with the respective formulas AlOx and CrOy such that x and y are strictly between 0.01 and 1.5. The main function of this layer, which is located just above the zinc-based coating layer containing magnesium, is to ensure its temporary protection. Its minimum thickness is set at 5 nm because the protection obtained is not sufficient below that. The maximum thickness is set at 100 nm to allow the easy elimination of most or all of the layer by a simple alkaline degreasing, especially when subsequent treatments of the sheet make it necessary or in order not to reduce the ability of the sheet to be phosphated and/or painted.

This layer includes aluminum, chromium, or substoichiometric oxides of these elements. In the context of this invention, substoichiometric oxides mean oxides of aluminum (AlOx) and chromium (CrOy) such that x and y are strictly between 0.01 and 1.5. This definition thus excludes so-called stoichiometric oxides in which x is 1.5 and whose formula is generally represented by $Al_2O_3$ and $Cr_2O_3$.

The invention relates more particularly to the deposition of these sub-stoichiometric oxides because they have good temporary protection performance.

It is also possible to deposit them by vacuum deposition with a deposition rate consistent with industrial requirements, i.e., to produce depositions of up to 100 nm per side at running speeds up to 300 m/min.

As will be understood, this layer may be deposited by any suitable vacuum deposition method, such as magnetron sputtering, electron beam deposition, or vacuum evaporation by Joule effect or induction.

The vacuum deposition method used for the deposition of this layer depends essentially on its nature. Accordingly, for the deposition of aluminum or chrome in metallic form, it is preferable to use magnetron sputtering. The deposition is carried out in a plasma (usually argon) through ion bombardment of a metal target made of the metal to be deposited.

When it is desired to deposit aluminum oxide or chromium oxide, this method can also be used. The injection of a reactive gas (in this case $O_2$) will then suffice. The $Ar^+$ ions from the plasma bombard the target and extract the atoms that are deposited on the substrate while reacting with the oxygen to give the desired deposition.

To be able to maintain good deposition efficiency using this method for these oxides at the conventional rates of the metallic coating lines, it is imperative to limit x and y values to strictly less than 1.5 because it has been observed that beyond this limit, the movement rates fall sharply (for example, 7 times) when this threshold is crossed.

Indeed, it is observed that the oxygen first reacts with the plasma, the sprayed metal particles, the walls of the room, and the target such that its partial pressure increases slowly. At the same time, the sputtering yield and therefore the deposition rate remain high.

Once the target surface and the walls of the vessel are saturated with oxide, the critical oxygen flow rate is reached above which the gas then reacts only very little with the metal, resulting in a sudden increase its partial pressure. At the same time, the sputtering yield and thus the deposition rate drop because the target surface is oxidized.

Another especially preferred deposition method is the vacuum evaporation deposition with the heating of the material to be deposited contained in a crucible by any suitable method, such as electron gun, induction, or resistance. This vacuum heating of the crucible containing the material to be deposited in solid or liquid form results in the formation of steam, which, when it condenses on the substrate heated to a temperature lower than that of the steam, leads to the formation of a deposition.

At a given pressure and temperature, the higher the rate of evaporation of the material, the higher the deposition rate. The evaporation rate of the material to be deposited is related to its saturation vapor pressure. At a given temperature, evaporation will occur if the saturated vapor pressure is greater than the total pressure in the deposition chamber.

When deposition of a substoichiometric oxide as defined above is desired, this method may be used by creating a plasma such as an argon-based plasma above the evaporation crucible and injecting oxygen into the vacuum chamber, thereby causing a reactive evaporation.

The evaporation and reactive evaporation techniques, however, do not make it possible to deposit stoichiometric oxides such as $Al_2O_3$ and $Cr_2O_3$ due to their vapor pressure, which is much lower than that of the corresponding pure metal compounds. Accordingly, the evaporation of oxides such as $Al_2O_3$ and $Cr_2O_3$ at reasonable speeds is not possible at temperatures similar to those that could be used for Al or Cr. The use of this method therefore also requires that the values of x and y values be strictly limited to less than 1.5.

It should be noted that other elements such as titanium, zirconium, or zinc, in metal or oxide form, cannot be used because their deposition rate is insufficient, regardless of the vacuum deposition method used. To obtain with these elements yields equivalent to those of aluminum or chromium, it would be necessary to raise the heating temperatures significantly (above 2,500° C.), which is not desirable from the point of view of safety and facility design, maintenance, and lifespan.

Preferably, the steel sheet includes another zinc-based coating beneath the zinc-based coating containing magnesium. This coating layer includes less than 0.05% magnesium by weight and preferably does not contain magnesium. However, it may contain up to 0.3% by weight of additional optional elements such as Si, Sb, Pb, Ti, Ca, Mn, Sn, La, Ce, Cr, Ni, Zr, or Bi, and up to 0.3% aluminum by weight.

It may be deposited on the steel sheet by any means known in the art, such as hot-dip coating, electro-galvanizing or even by vacuum deposition as described above for the zinc- and magnesium-based layer.

When this layer is present, its thickness is generally between, for example, 1 and 10 µm, preferably between 1 and 6 µm. The thickness of the zinc- and magnesium-based layer can thus be reduced and is preferably between 1 and 4 µm.

One of the features of the coating according to the invention is that the zinc-based layer containing magnesium is not alloyed with the temporary protective layer or with the underlying zinc-based layer when that layer is present in the multilayer coating. Preferably, this zinc-based layer containing magnesium is not obtained as a result of Palliation of a zinc-based layer and a magnesium-based layer, but by the deposition of a zinc and magnesium alloy.

This feature makes it possible to control with precision the composition of this layer, upon which the pitting corrosion wear properties that are essential for the industry depend. It also makes it possible to avoid implementing a diffusion heat treatment, which would add an extra step in the manufacturing process and is difficult to control, and any diffusion between the substrate and the coating is generally to be avoided.

Accordingly, a manufacturing process will be used in which all of the coating layers are deposited by a vacuum method, which will have the further advantage of not having to operate in an inert atmosphere.

The invention will now be explained by tests, a non-exhaustive list of which appears below.

Tests

Surface Corrosion

The test conducted is also called a humidotherm test and is conducted in a climate chamber according to DIN EN ISO 6270-2.

Temporary protection against corrosion can be evaluated on flat panels simulating a sheet during storage or transport, or on distorted panels representing a metal part (for example, a car door) stamped in one place and transported to another.

Each panel to be tested is then degreased and coated on both faces with a suitable oil using a spray-oiling device according to the VDA 230-213 standard, with an oil coating weight of 1.2 g/m$^2$. The panels are oiled using Fuchs Anticorit RP 4107S at 1.2 g/m$^2$ when the test is conducted for a German manufacturer or using Quaker Ferrocoat N 6130 when the test is conducted for a French manufacturer. These panels are left unassembled and unpainted. A series of aging cycles of 24 hours is then applied to the panels. Each cycle includes:

8 hours at 50° C.±3° C. and about 98% relative humidity (climate chamber closed, including during heating), followed by 16 hours at 21° C.±3° C. and less than 98% relative humidity (climate chamber open or ventilated, including during cooling).

At the end of the series of cycles, changes in the surface appearance of the panels are evaluated in terms of percentage of the area that was changed.

The proportion of change in the surface appearance must be less than 15% after 10 cycles for samples treated with Quaker oil or after 15 cycles for samples treated with Fuchs oil.

Phosphating Ability

The samples are degreased and phosphated under the following conditions:

| Stage | Product(s) | Parameters | Temperature | Duration |
|---|---|---|---|---|
| 1—Alkaline degreasing | Gardoclean S5176 15 +/− 0.3 g/l Gardobond H7352 1.5 +/− 0.1 g/l | Free alkalinity = 6.8-7.4 pts | 55° C. +/− 1° C. | 6 min |
| 2—Rinsing | Hard water | | room temperature | 1 min |
| 3—Activation | Gardolene V6513 (Powder refiner) 0.3 to 0.4 g/l | | room temperature | 45 s |
| 4—Phosphating | Gardobond R24 TA, Gardobond H7141, H7164, H7257, H7101, H7155 | Free acidity = 1-1.2 pts Free fluorides = 230 +/− 50 ppm Compensating rate = 1.5-2.5 pts | 50° C. +/− 1° C. | 3 min |
| 5—Rinsing | Hard demineralized water | | room temperature | 1 to 2 min |

The degree of coverage of the phosphate layer is then evaluated using a scanning electron microscope: the microscopic appearance of bright areas will be a sign of the absence of phosphate film, while the matte areas will correspond to the properly phosphated surfaces. The target value is set to 100% coverage of the surface studied.

Cosmetic Corrosion

Cosmetic corrosion is evaluated on painted, unassembled samples to which a 1 mm wide scratch has been applied. The depth of the scratch is such that it passes through the coating and into the steel.

The samples are subjected to ten cyclic corrosion test cycles according to the VDA 621-415 standard, and each one-week cycle includes:

24 hours of salt spraying (5% NaCl, 1.5 ml/h) at 35° C.
Followed by four consecutive sequences of:
  8 hours at 40° C. and about 99% relative humidity, followed by
  16 hours at 23° C. and about 50% relative humidity
Followed by 48 hours at 23° C. and about 50% relative humidity.

The delamination rate for the scratch is then determined: the maximum width of sample degradation around the scratch, which manifests itself in the form of paint blistering, is measured, then the width of the scratch is subtracted and the result is divided by two. The determination is done using templates that take the form of rectangles of different sizes drawn on a transparent substrate. They are used to determine the maximum width of degradation by overlapping them with the scratch being tested: the rectangle that most tightly frames the degraded surface is used.

Tests

Three sets of tests are conducted on three samples of cold-rolled DC06 steel sheets as sold by ArcelorMittal including an initial zinc coating with a thickness of 6 μm topped with a zinc and magnesium alloy coating corresponding to the formula $Zn_2Mg$ and having a thickness of 3 μm. These two coating layers were deposited by a vacuum evaporation method via induction.

A portion of the samples are then given at a laboratory facility an additional coating layer defined according to the characteristics listed in Table 1. These coatings are obtained by magnetron sputtering. In the case of Test No. 3, a reactive magnetron sputtering method was used with an injection rate of 500 cm³/min of oxygen.

TABLE 1

| Sample | Coating |
|---|---|
| 1 | No additional deposition |
| 2* | 50 nm aluminum |
| 3* | 50 nm $CrO_x$ with x = 1.45 |

*according to the invention

They are then subjected to surface corrosion, phosphating ability, and cosmetic corrosion tests. The results are summarized in Table 2:

TABLE 2

| Sample | Surface corrosion (%) | Phosphating (% coverage) | Cosmetic corrosion (max width - mm) |
|---|---|---|---|
| 1 | 100 | 100 | 3 |
| 2* | <5 | 100 | 2 |
| 3* | <5 | 100 | 2 |

*according to the invention

During the phosphating ability tests, it appears that the entire aluminum layer in Test 2 is eliminated at the end of alkaline degreasing. As for the oxide layer in Test 3, part of it remains, which does not preclude the proper phosphating of the surface due to its thinness.

It was found that the coated sheet according to the invention exhibits good phosphating ability and surface corrosion resistance and improved cosmetic corrosion compared to a sheet not having a temporary protective coating according to the invention.

In addition, the deposition rates for the two tests conducted according to the invention may be used to extrapolate deposition rates in industrial production of 100 nm/side to 300 m/min.

What is claimed is:

1. A steel sheet with a multilayer coating comprising:
   at least one zinc-based layer including from 0.1% to 20% magnesium by weight; and
   a temporary protective layer covering the at least one zinc-based layer, the temporary protective layer being between 5 and 100 nm and consisting of metal or metallic oxide selected from the group consisting of aluminum, chromium, aluminum oxides $AlO_x$, x being from 0.01 to 1.5, and chromium oxides $CrO_y$, y being from 0.01 to 1.5,
   the at least one zinc-based layer not being alloyed with the temporary protective layer.

2. The steel sheet according to claim 1, wherein the multilayer coating further comprises:
   a second zinc-based layer of less than 0.05% magnesium by weight, covered by the at least one zinc-based layer, which is covered by the temporary protective layer, the at least one zinc-based layer not being alloyed with the temporary protective layer or the second zinc-based layer.

3. The steel sheet according to claim 2, wherein the at least one zinc-based layer and the second zinc-based layer further include from 0.1% to 10% aluminum by weight.

4. The steel sheet according to claim 1, wherein the at least one zinc-based layer is formed from $Zn_2Mg$.

5. The steel sheet according to claim 1, wherein the temporary protective layer is formed from aluminum.

6. The steel sheet according to claim 1, wherein the temporary protective layer has a thickness between 5 and 50 nm.

7. The steel sheet according to claim 1, wherein the at least one zinc-based layer is 0.1% to 10% aluminum by weight.

8. A sheet manufacturing method comprising the steps of:
   forming the multilayer coated steel sheet according to claim 1 by:
      supplying a bare steel sheet;
      applying the at least one zinc-based layer to the bare steel sheet; and
      depositing the temporary protective layer over the at least on zinc-based layer by vacuum deposition.

9. The manufacturing method according to claim 8, wherein the at least one zinc-based layer is applied by vacuum deposition.

10. A manufacturing method for a part from the steel sheet according to claim 1, comprising the steps of:
   coating the steel sheet with a lubricating oil in an amount less than or equal to 1 g/m²;
   forming the sheet by drawing; and
   subjecting the steel sheet to alkaline degreasing.

11. A steel sheet with a multilayer coating consisting of:
   at least one zinc-based layer including 0.1% to 20% magnesium by weight, covered by a temporary protective layer of between 5 and 100 nm consisting of metal or metal oxide selected from the group consisting of aluminum, chromium, aluminum oxides $AlO_x$, x being strictly between 0.01 and 1.5, and chromium oxides $CrO_y$, y being strictly between 0.01 and 1.5, with the at least one zinc-based layer not being alloyed with the temporary protective layer.

\* \* \* \* \*